United States Patent [19]
Martin et al.

[11] Patent Number: 5,304,950
[45] Date of Patent: Apr. 19, 1994

[54] LOW POWER, LOW NOISE PREAMPLIFIER WITH OFFSET VOLTAGE CANCELLATION

[75] Inventors: Mark V. Martin; David L. LeFevre, both of Redondo Beach; Raymond Kwok, Walnut, all of Calif.

[73] Assignee: Hughes Aircraft Company, Los Angeles, Calif.

[21] Appl. No.: 921,679

[22] Filed: Jul. 30, 1992

[51] Int. Cl.$^5$ .............................................. H03F 3/08
[52] U.S. Cl. .................................... 330/308; 330/147; 330/148; 330/295; 250/214 A; 348/241
[58] Field of Search ............ 330/59, 147, 148, 124 R, 330/295, 308; 250/214 A; 358/213.15, 213.18

[56] References Cited

U.S. PATENT DOCUMENTS

| | | | |
|---|---|---|---|
| 4,263,561 | 4/1981 | Weber | 330/147 X |
| 5,107,224 | 4/1992 | Meyer | 330/147 |

FOREIGN PATENT DOCUMENTS 250769  12/1985  Japan ............................ 358/213.15

OTHER PUBLICATIONS

1984 D.A.T.A.BOOK, vol. 29, Book 2, Mar. 1984, pp. 12, 38, 144.

Primary Examiner—James B. Mullins
Attorney, Agent, or Firm—Michael W. Sales; Wanda K. Denson-Low

[57] ABSTRACT

Apparatus and methods are disclosed for providing a low power, low noise preamplifier, especially useful with a Forward Looking Infrared (FLIR) sensor array. Utilizing a differential amplifier, where one half of the differential pair is shared among a plurality of channels, the power consumption of the amplifier is effectively reduced. Such an arrangement also eliminates the need for bulky coupling capacitors used in ac-coupled, single ended amplifiers. In addition, cross-talk between sensor outputs caused by detector ground impedance is reduced.

10 Claims, 6 Drawing Sheets

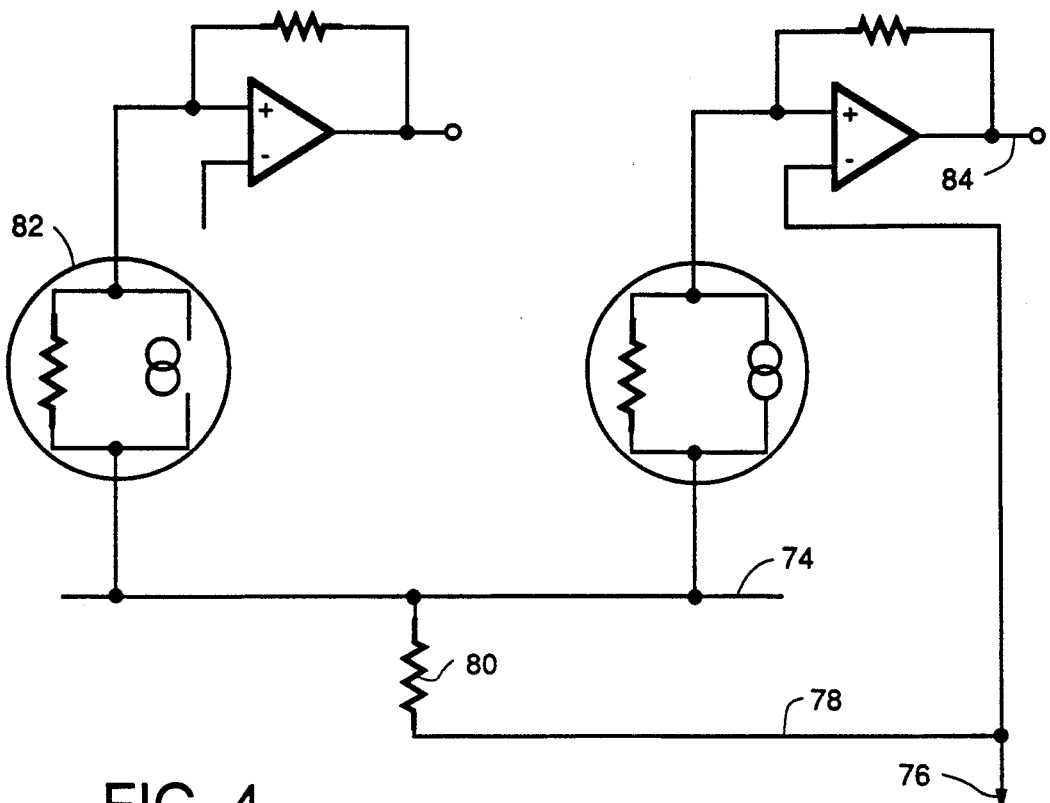
FIG. 4.
FIG. 6c.
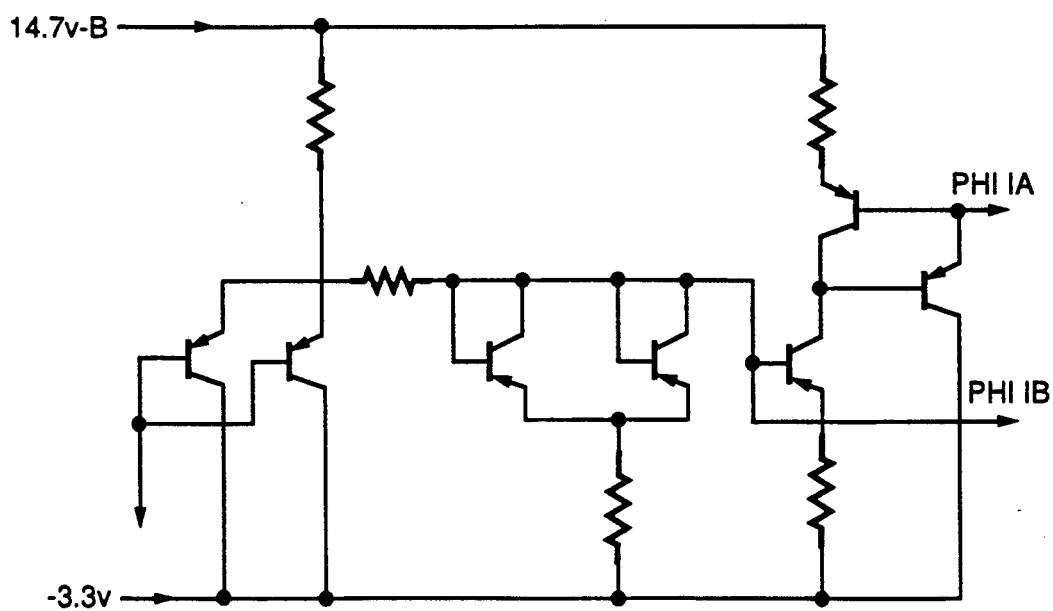

5,304,950

LOW POWER, LOW NOISE PREAMPLIFIER WITH OFFSET VOLTAGE CANCELLATION

BACKGROUND OF THE INVENTION

1. Field of the Invention

The invention relates generally to an improved preamplifier for use typically with a photoconductive sensor array.

2. Description of the Related Art

A scanning imaging system comprises a sensor array typically having 50 to 500 sensors which scan a desired scene and produce output signals which are then used to generate a video display of the scanned scene. Typically, the output signals from the sensors are initially fed through preamplifiers. Until now, however, there were many drawbacks with the preamplifiers, including physical size and power consumption.

For example, ac-coupled, single ended amplifiers require a physically large ac coupling capacitor. In addition to its size, the capacitor is the most unreliable component in the circuit and degrades system performance in several ways. First, the capacitor increases the system's sensitivity to microphonics. Second, on low frequency signals such as a scan of the sky, the charge on the capacitor will leak causing a change in the video display when in fact the detectors have sensed no change. Third, capacitors require long recovery times after an input overdrive. Further, with an ac-coupled, single ended amplifier, the bias signals for the detector are typically supplied by a separate circuit.

Even the traditional low noise differential amplifier which is dc-coupled to the detectors has limitations, including its level of power consumption and cross-talk. It would be advantageous to reduce the power dissipated by the differential amplifier, as well as reducing the cross-talk that occurs between sensor outputs.

Until now, the physical size and power consumption of the preamplifiers prevented the location of the preamplifiers adjacent to the sensors. It would be advantageous to have a preamplifier that is smaller and consumes less power. Such a preamplifier could be located adjacent to the sensor array, thus reducing cabling costs and improving performance and reliability.

SUMMARY OF THE INVENTION

In accordance with the invention, low power, low noise preamplifiers with offset voltage cancellation comprise means for reducing the power consumption of a preamplifier, including means for reducing power consumption of bias circuits, means for reducing the effects of detector bias voltages, and means for reducing cross-talk between sensor outputs.

The preamplifiers amplify the detector signals received from a scanning sensor array. Typically, an array consists of 50 to 500 aligned sensors that each generate signals used to produce a video display of the scene scanned by the sensor array. In one preferred embodiment, an array of 160 sensors is divided into eight groups of 20 sensors each.

The apparatus according to the invention comprises a multi-channel low-noise preamplifier in which each channel uses a differential common base input stage wherein one side of the differential stage is shared among all the channels to reduce power consumption and to cancel the bias voltage associated with the detector impedance.

The apparatus provides low noise amplification for low impedance sensor arrays while achieving reduced power consumption and physical size. As a result, the apparatus can be located adjacent to the sensors, thus reducing cabling costs and improving performance and reliability.

The apparatus also cancels most of the detector input bias voltages, enabling high gain amplification with dc coupling to the detector. This allows the use of lower supply voltages which reduces power consumption. In addition, large detector coupling capacitors, and the attendant performance degradation associated with them, are eliminated.

The method provides low power, low noise amplification with offset voltage cancellation and reduces the power consumption of the bias circuits. This is due in part to the preamplifier input stage bias current flowing through the detector, thereby reducing or eliminating the need for additional bias current. In addition, the effects of detector bias voltages are reduced and cross-talk between sensor outputs is also reduced.

BRIEF DESCRIPTION OF THE DRAWINGS

FIG. 4 is a schematic diagram illustrating the cross-talk between channels;

FIGS. 6A, 6B and 6C present a schematic diagram of a preferred embodiment of a 20-channel preamplifier fabricated as a monolithic integrated circuit for use in a scanning imaging system.

DESCRIPTION OF THE PREFERRED EMBODIMENTS

Figure 1:
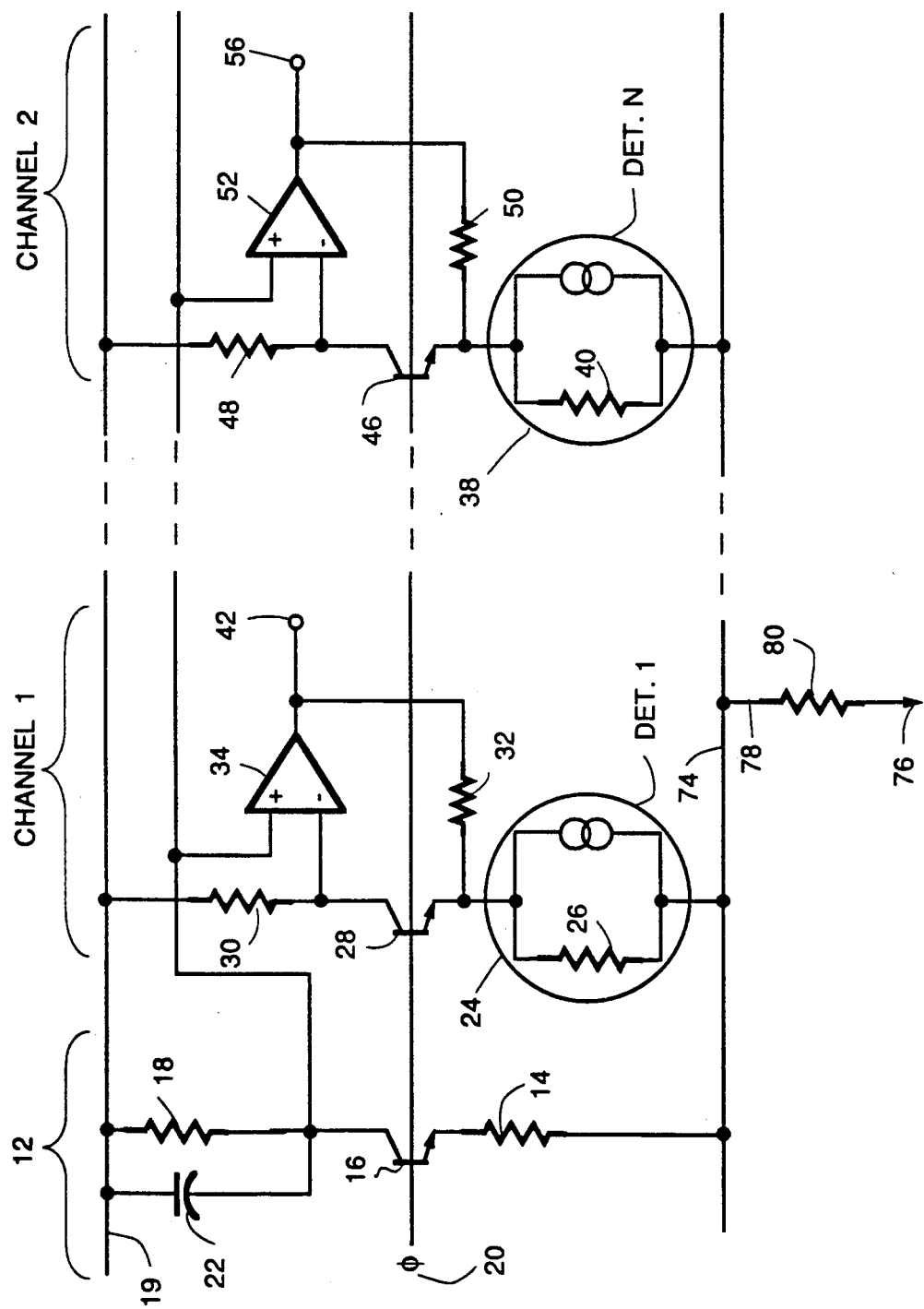
FIG. 1 is a simplified schematic diagram of a preamplifier having N channels.

Methods and apparatus are shown in accordance with the invention of an improved low power, low noise preamplifier. FIG. 11 shows a simplified schematic diagram of a preamplifier having multiple channels. The preamplifier utilizes a common circuit 12 which is paired with a plurality of channels. The common circuit 12 provides a first half of a differential pair, which is shared among each of the N channels, each of said channels providing a second half of the differential pair for that channel.

The components of the common circuit 12 include a transistor 16, a collector resistor 18, and common resistor 14. The collector resistor 18 is coupled between a positive supply voltage line 19 and the collector of transistor 16. The emitter of transistor 16 is coupled to a first lead of resistor 14. A second lead of resistor 14 is coupled to detector ground 74. In addition, an input dc bias source 20 is coupled to the base of transistor 16. Finally, a filter capacitor 22 is connected in parallel with resistor 18 to filter out the noise of the common circuit 12.

The circuit for channel 1 of the preamplifier shown in FIG. 1 comprises a collector resistor 30 coupled between the positive supply voltage line 19 and the collector of a transistor 28. The base of transistor 28 is connected to the input dc bias source 20 in common with the base of transistor 16 of the common circuit 12. The emitter of transistor 28 is connected to a first lead of a detector 24. The second lead of the detector 24 is connected to detector ground 74.

The circuit for channel 1 also contains an operational amplifier (op amp) 34. The non-inverting input of op amp 34 is connected to the junction of collector resistor 18 and the collector of transistor 16 of the common circuit 12 whereby the common circuit 12 supplies a bias voltage to the op amp 34. The junction of collector resistor 30 and the collector of transistor 28 of the circuit for channel 1 is connected to the inverting input of op amp 34. The output 42 of op amp 34 is connected through a feedback resistor 32 to the junction of detector 34 and the emitter of transistor 28.

Each of the N channels of the preamplifier shown in FIG. 1 is substantially the same as the circuit shown for channel 1. Thus, the circuit for channel N, representative of the circuits for channels 2 through N comprises a collector resistor 48 coupled between the positive supply voltage line 19 and the collector of a transistor 46. The emitter of transistor 46 is connected to a first lead of a detector 38. The second lead of detector 38 is connected to detector ground 74. The circuit for channel N also contains an op amp 52. The non-inverting input of op amp 52 is connected to the unction of collector resistor 18 and the collector of transistor 16 of the common circuit 12 whereby the common circuit 12 supplies a bias voltage to the op amp 34. The junction of the collector resistor 48 and the collector of transistor 46 is connected to the inverting input of op amp 52. The output 56 of op amp 52 is connected through a feedback resistor 50 to the junction of detector 38 and the emitter of transistor 46. The input dc bias source 20 common to each of the channels is coupled to the base of transistor 46.

The common circuit 12 approximates the circuits of each of the channels, such that the resistance of resistor 14 of the common circuit is substantially equal to the resistance of each of the detectors 26 through 40. In a preferred embodiment, an adjustable current source (not shown in FIG. 1) is provided for the common circuit and each of the circuits for channels 1 through N. The adjustable current source is placed in parallel with resistor 14 of the common circuit, and in parallel with detectors 24 through 38 for each of the channels 1 through N. This allows adjustment for variations in the resistances of the individual detectors. Since the resistance of resistor 14 is selected to substantially equal the resistance of each of the detectors 24 through 38, the current that flows through collector resistor 18 is substantially equal to the current that flows through collector resistor 30, and equal to the current that flows through collector resistor 48. When no signal current flows through detectors 24 through 38, then the voltage outputs from op amps 34 through 52 are equal. Assuming ideal op amps, the signal voltage output from each op amp 52 is equal to the signal current flowing through its associated detector 38 multiplied by the resistance of the feedback resistor 50.

Thus, the common circuit 12 of FIG. 1 enables the preamplifier to take advantage of the virtues of a differential amplifier while providing a dc bias to the non-inverting input of each channel's op amp. The result is the canceling of the detector offset voltage present at the input/emitter of each channel's transistor.

Traditionally, input noise voltage to an amplifier has been reduced by minimizing the circuit's equivalent input noise resistances, partly achieved by increasing the collector currents. However, this results in high power consumption. By using the common circuit 12 as one half of the differential pair shared among each of the channels, noise is reduced and power consumption is minimized.

Figure 2:
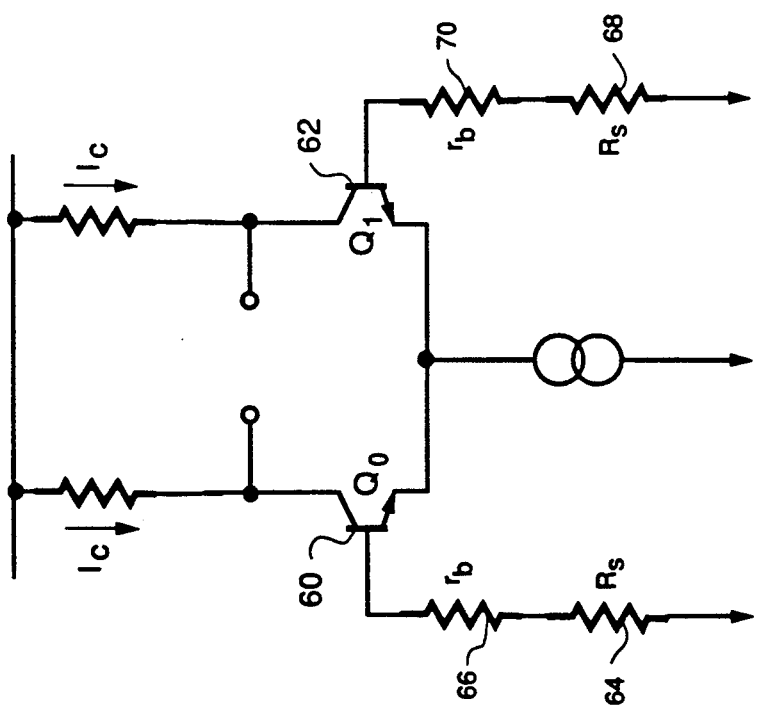
FIG. 2 is a schematic diagram modeling the resistances and collector currents of a prior art differential pair.

FIG. 2 models the resistances and currents associated with a traditional differential pair. Transistor 60 ($Q_0$) present in the first half of the differential pair, has associated with it a parasitic resistance 66 ($r_b$), as well as a source resistance 64 ($R_S$). Likewise, in the second half of the differential pair, transistor 62 ($Q_1$) has associated with it a parasitic resistance 70 ($r_b$), as well as a source resistance 68 ($R_S$). Each of these resistances impact on the noise level of the preamplifier, such that:

$$\text{Noise} \approx \sqrt{4kT[2R_S + 2r_B + 2(V_T/2I_c)]}$$

where
$R_S$ is the source resistance;
$r_B$ is the parasitic base resistance of the transistors;
$V_T$ equals kT/q (26 mV at room temperature); and
$I_c$ is the collector current of the transistors.

Figure 3:
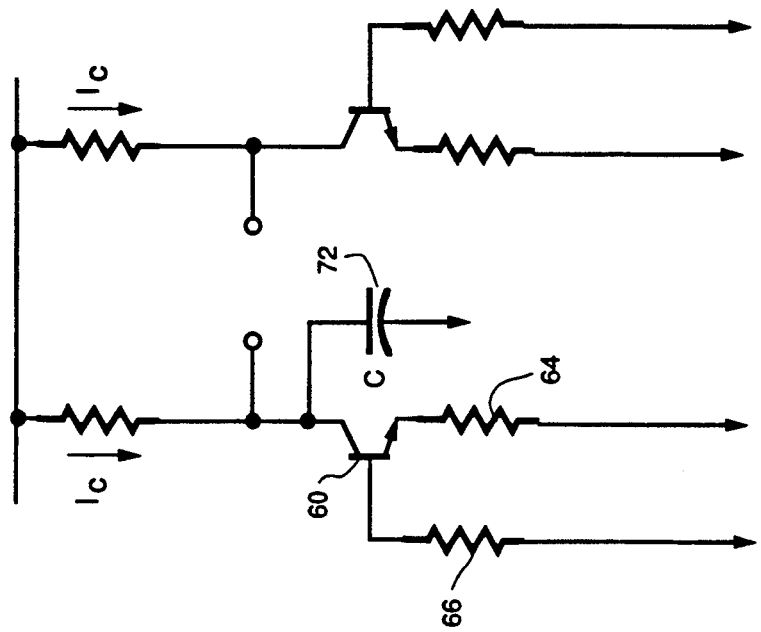
FIG. 3 is a schematic diagram modeling the resistances and collector current of the shared differential pair of the invention.

As shown in FIG. 1, a filter capacitor 22 is employed to filter out the noise of the common circuit 12 of the shared differential pair. As FIG. 3 illustrates, a filter capacitor 72 (C), typically having a value between 1 and 100 $\mu$f, in parallel with the collector of transistor 60, bypasses the noise resulting from the transconductance ($V_T/I_c$) of transistor 60 and the parasitic resistance 66 ($r_b$) of transistor 60, as well as the source resistance 64 ($R_S$). Thus, the noise associated with the improved preamplifier is:

$$\text{Noise} \approx \sqrt{4kT[R_S + r_B + (V_T/2I_c)]}$$

where
$R_S$ is the source resistance associated with channel 1 only;
$r_B$ is the parasitic base resistance of transistor 60 only;
$V_T$ equals kT/q (26 mV at room temperature); and
$I_c$ is the collector current of the transistors.

The equations show that for a given collector current $I_c$, the differential pair of FIG. 2 has greater noise than the shared differential pair of FIG. 3, by a factor of approximately $\sqrt{2}$ at frequencies high enough that capacitor 72 is effectively a short-circuit. That is, to reduce the noise in the differential pair of FIG. 2 to the equivalent noise level of the shared differential pair of FIG. 3, assuming that $R_S$ and $r_B$ equal zero, the collector current $I_c$ would need to be doubled. Doubling the collector current $I_c$ would result in an increase in the power used by the preamplifier circuits. Thus the shared differential pair of FIG. 3 provides the equivalent noise level with approximately half the power.

Since the common circuit is shared among a plurality of channels, the power savings increase substantially as the number of channels in the preamplifier increases. As an illustration, for a ten channel preamplifier, the total of the collector currents in the shared differential pair in FIG. 3 is the sum of one $I_c$ for each of the ten channels, plus one $I_c$ for the common circuit, or $11(I_c)$.

A substantially higher total of collector currents, and thus higher power use, results from the differential pair in FIG. 2. For a ten channel preamplifier having the same level of noise as the shared differential pair, the total of the collector currents is equal to $40(I_c)$, as compared to $11(I_c)$ for the shared differential pair. Since the traditional differential pair does not share a common circuit, each channel draws two $I_c$, one in each half of the differential pair as shown in FIG. 2. In addition, however, to achieve the same noise level as the shared differential pair, the differential pair in FIG. 2 must double the collector current $I_c$. Thus, each channel draws the equivalent of four $I_c$. For ten channels, the total of the collector currents is $40(I_c)$.

In a preferred embodiment, collector currents flow through the detectors, further reducing power consumption. The resistance of a detector changes as the detector scans a changing scene. A bias current flowing through the detector will result in a change in the voltage across the detector as the resistance of the detector changes. Traditionally, this bias current was provided by a separate circuit. Here, however, the bias current is supplied by the associated transistor, thus saving power.

A further advantage of the invention is the reduction in cross-talk, an improvement of the signal to cross-talk ratio typically from 20:1 to up to 100:1. Cross-talk is the undesired appearance of a signal from a first channel at the output of other channels. Cross-talk is caused by detector ground impedances and the low impedance inputs of the preamplifier. The low impedance inputs are apparent with the detector feeding directly into the transistor emitter (an impedance around 50 ohms or less). This low impedance is further magnified by negative feedback through feedback resistors 32 through 50.

FIG. 4 illustrates the use of both the detector ground bus 74 and the system ground 76. The ground lead of each of the detectors is connected to the detector ground bus 74. The detector ground bus 74 in turn is connected to the system ground 76. In a typical scanning imaging system, the connection 78 of the detector ground bus 74 to system ground 76 has substantial impedance (typically 3 to 20 ohms), shown as a resistor 80.

Since each detector is biased with respect to the detector ground bus 74, detector currents that flow from the detector ground bus 74 through resistor 80 to the system ground 76 change the bias. As shown in FIG. 4, the current that flows through detector 82 flows through the detector ground bus 74 and through the resistance 80 of the connection to system ground 76. As illustrated, the current from detector 82 cross-talks into the output of channel 84.

Cross-talk is reduced in preferred embodiments by using the differential operation. As shown in FIG. 1, by coupling resistor 14 to detector ground 74, the common circuit 12 is likewise biased to detector ground 74, and in differential operation, the cross-talk is reduced.

Figure 5:
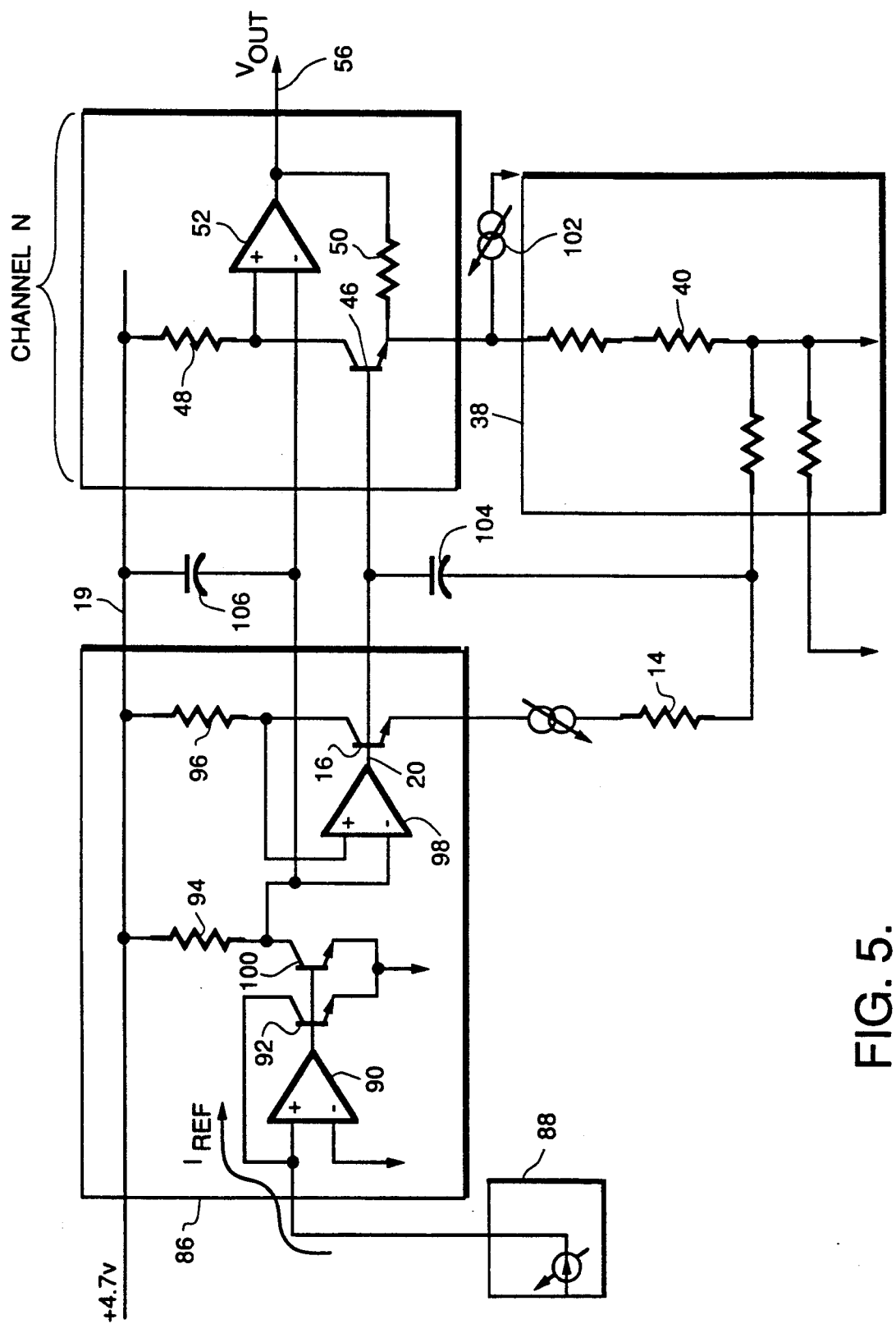
FIG. 5 is a schematic block diagram of a preferred embodiment illustrating the operation of the bias circuit.

FIG. 5 is a schematic block diagram of a preferred embodiment illustrating the operation of the bias circuit 86. $I_{REF}$, the operating current of the input stages, is set by a variable current source 88. In operation, the feedback action of an op amp 90 forces the collector of a transistor 92 to be at ground, thus the collector current through transistor 92 is equal to $I_{REF}$. The collector current of a transistor 100 mirrors the collector current of transistor 92. Since op amp 98 drives transistor 16, the voltages across resistors 94 and 96 are equal, and the collector currents of transistor 100 and 16 are equal. Thus, where the resistance of resistor 14 equals the resistance of resistor 40, $V_{OUTN}$ 56 equals zero, and the collector currents for transistors 16, 46, and 100 equal $I_{REF}$.

In preferred embodiments, to save additional power, transistor 92 is proportionately smaller than transistor 100, such that the collector currents for transistors 46 and 100 are approximately equal to ten times the collector current of transistor 92 and, therefore, also about ten times the operating current $I_{REF}$. Capacitors 104 and 106 are provided to filter out the noise of the bias circuit. An adjustable current source 102 is provided between the detector and the associated transistor to compensate for any variations in the resistances of the detectors and the resistor 14 of the common circuit.

Figure 6A:
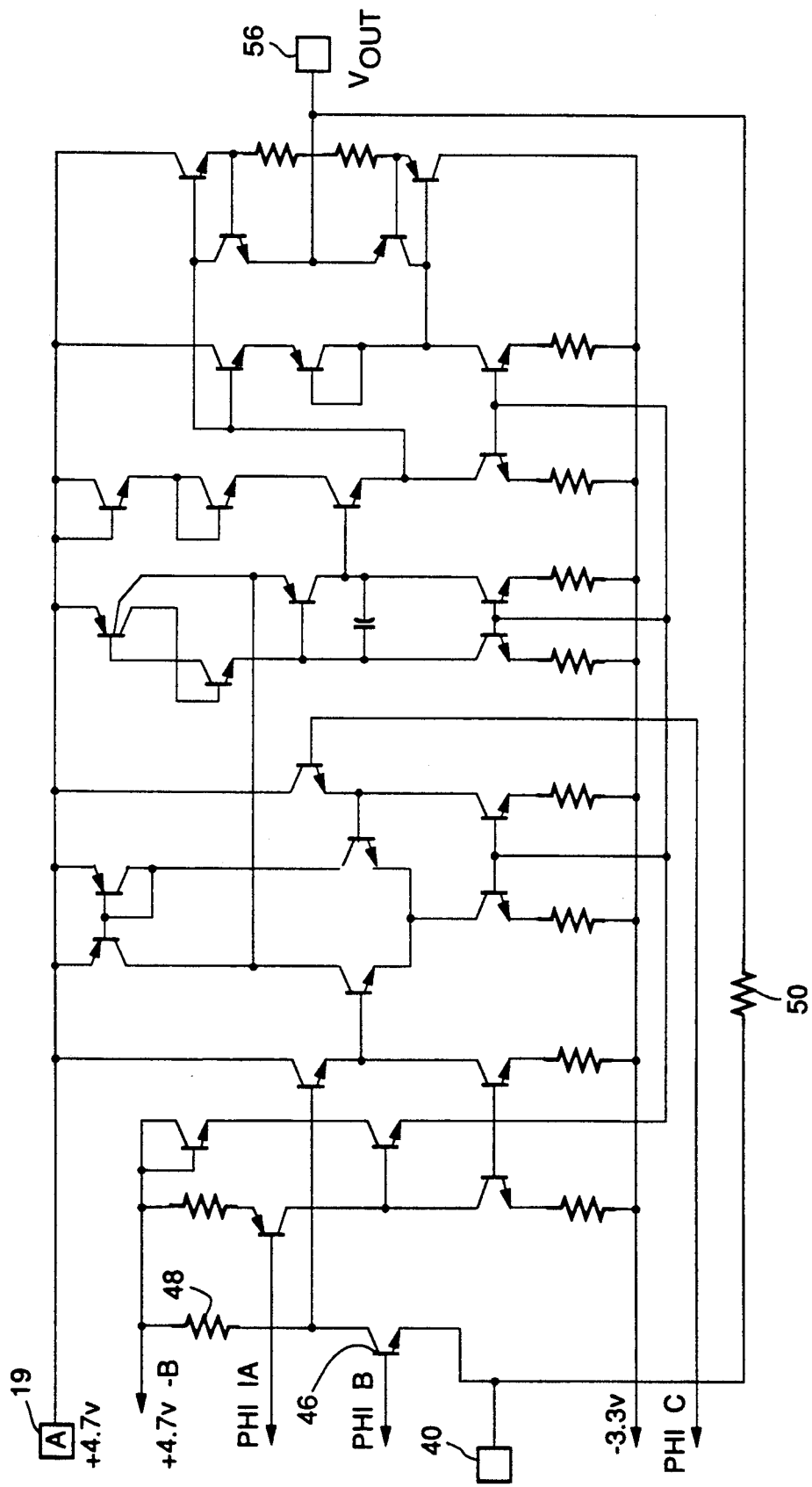
Figure 6B:
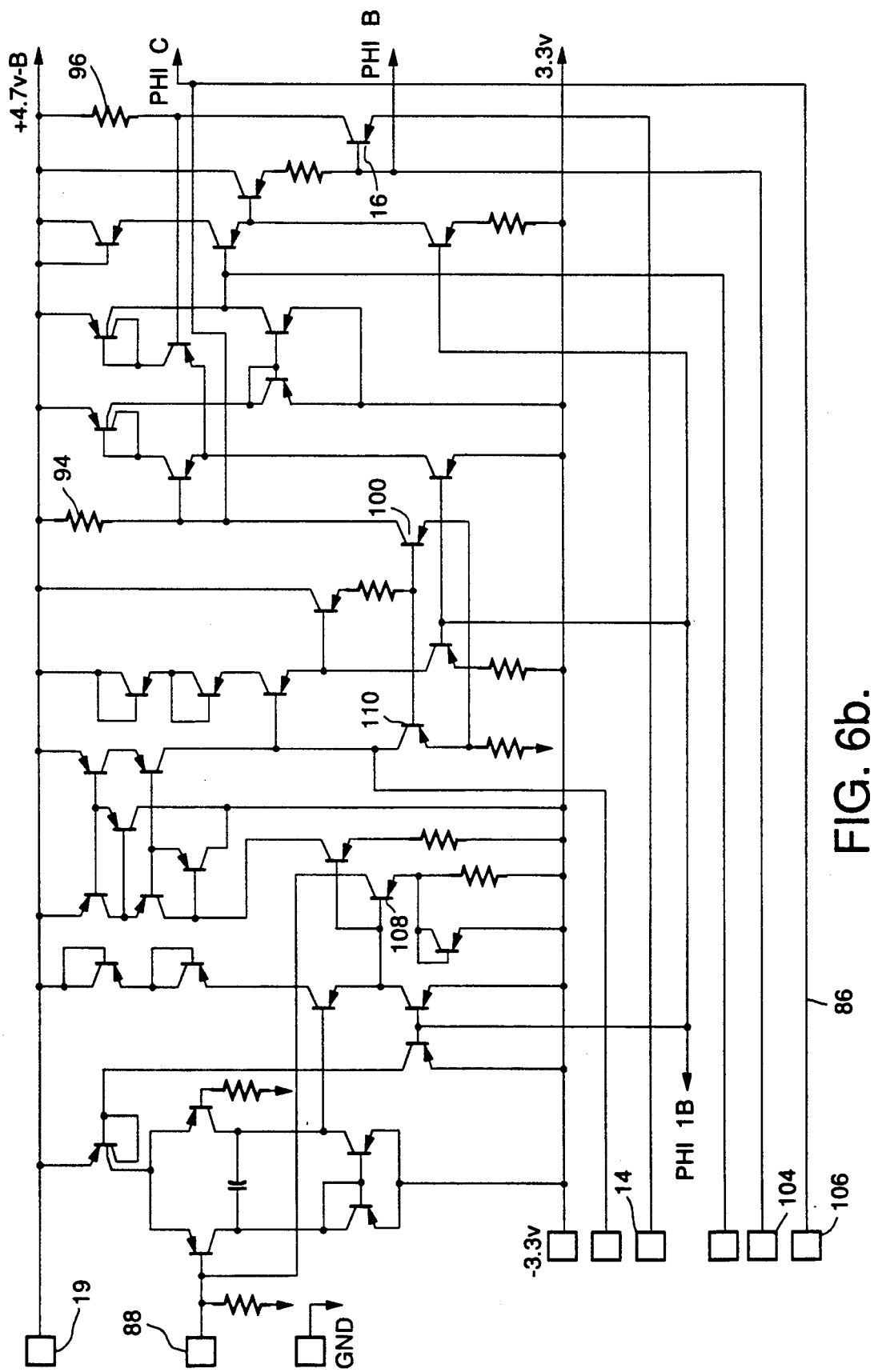
Figure 6A:
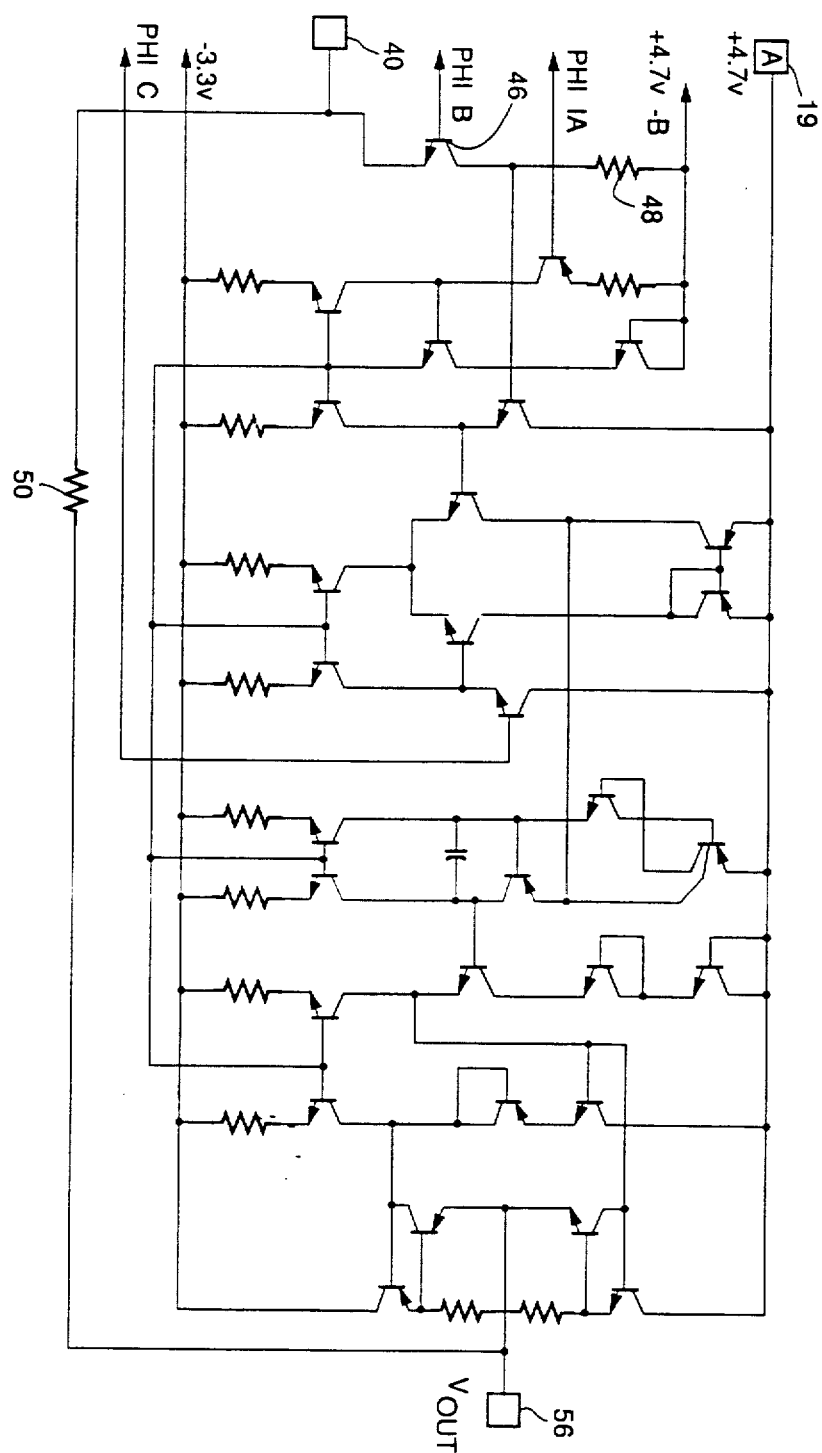
Figure 6B:
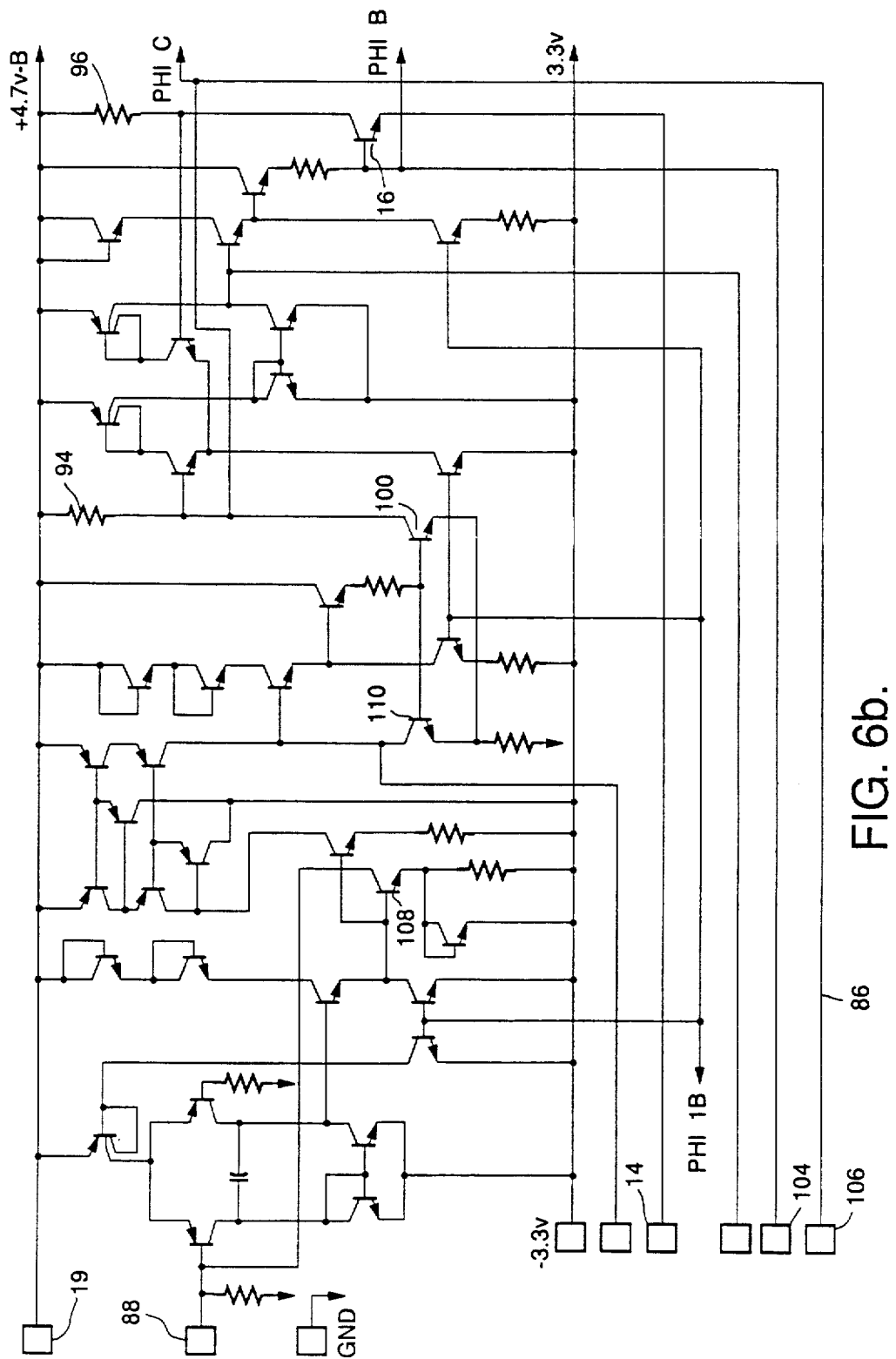

FIGS. 6A, 6B, and 6C show a schematic diagram of a preferred embodiment of a 20-channel preamplifier fabricated as a monolithic integrated circuit for use in a scanning imaging system. FIG. 6A illustrates one of twenty detector circuits used in the 20-channel preamplifier. One bias circuit 86 is contained on the 20-channel preamplifier as shown in FIG. 6B, in addition to the circuit shown in FIG. 6C.

FIG. 6A illustrates, in the detailed schematic, the positive supply voltage line 19, resistor 40, transistor 46, collector resistor 48, feedback resistor 50, and $V_{OUTN}$ 56 identified in FIG. 5. Resistor 40 has a connection to detector 38 as shown in FIG. 1. FIG. 6B likewise shows bias circuit 86 and the connections for common resistor 14, the positive supply voltage line 19, $I_{REF}$ 88, and capacitors 104 and 106, as well as transistors 16 and 100, and resistors 94 and 96 of the bias circuit 86 as identified in FIG. 5. Transistors 108 and 110 in combination perform the function of transistor 92, shown in FIG. 5.

Listed below are typical performance values for the 20-channel preamplifier fabricated as a monolithic integrated circuit, measured at room temperature.

The power consumption of the shared differential amplifier is 9.7 milliwatts per channel. This compares to 27 milliwatts per channel for a dc-coupled differential amplifier. Each detector was operated at 1 milliampere detector bias current and comparable gain.

The noise for both the shared differential amplifier and the dc-coupled differential amplifier measured 1.5 $nV/\sqrt{Hz}$ at 5 kHz.

A ground voltage rejection ratio of 37 dB demonstrates that the shared differential pair architecture rejects a voltage difference between the detector ground and the system ground by 37 dB.

A channel to channel cross-talk measurement of $-60$ dB at 1 kHz (19 of 20 channels driven at 1 kHz) illustrates the reduction of cross-talk through the bias circuit and the shared half of the input differential pair.

A power supply noise rejection of 60 dB at 100 kHz results from the use of the differential architecture.

The above-described embodiments are furnished as illustrative of the principles of the invention, and are not intended to define the only embodiment possible in accordance with our teaching. Rather, the invention is to be considered as encompassing not only the specific embodiments shown, but also any others falling within the scope of the following claims.

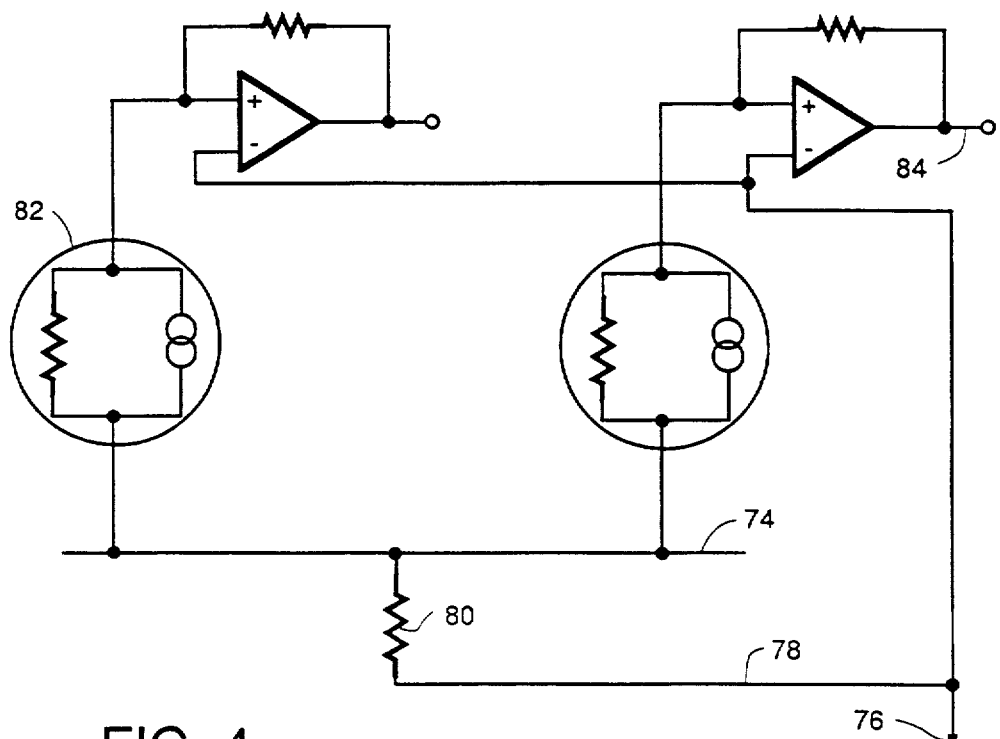
FIG. 4.
FIG. 6c.
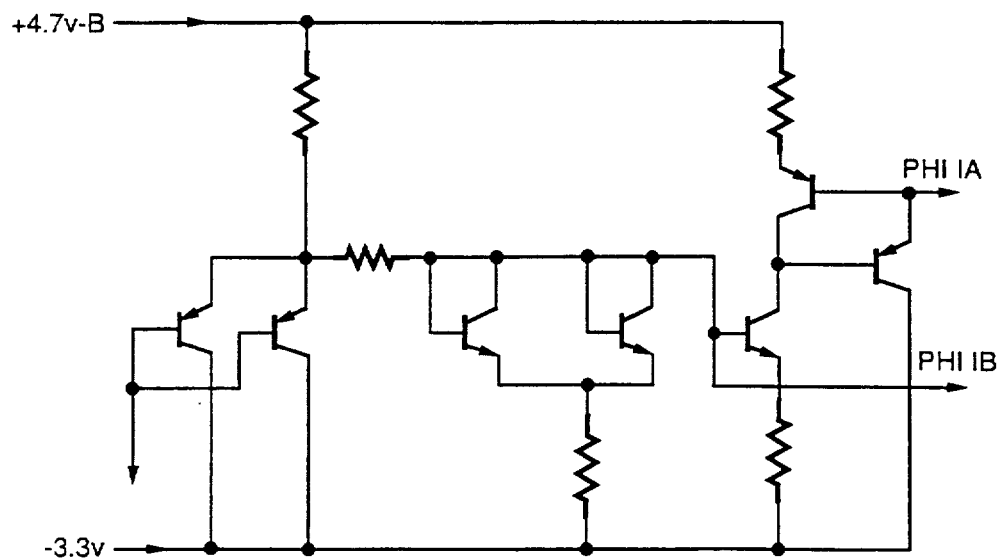

What is claimed is:

1. A preamplifier comprising:
    first circuit means for generating a first differential signal;
    an array of second circuits, including means for generating a second differential signal for each of said second circuits, such that said second differential signals are at desired levels with respect to said first differential signal, each of said second circuits having means for providing input signals to said second circuits to produce changes in said second differential signals in response to changes in said input signals, said means for providing input signals including a detector array, wherein each detector of said detector array is coupled at a first end to a detector ground bus and at a second end to one of said second circuits, said preamplifier having a system ground in addition to said detector ground bus, further comprising means for reducing cross-talk between said second differential signals;

means for comparing said first differential signal with each of said second differential signals to provide resultant signals associated with each of said second circuits based upon said comparisons; and amplifier means for amplifying each of said resultant signals.

2. The preamplifier in claim 1 wherein said detector array produces said input signals in response to changes in electromagnetic radiation detected by said detector array.

3. The preamplifier of claim 2 wherein said resultant signals correspond to said changes in electromagnetic radiation detected by said detector array.

4. The preamplifier of claim 1 wherein said means for reducing cross-talk comprises ground sensing means for coupling said first circuit means to said detector ground bus.

5. A multi-channel differential amplifier, said differential amplifier having an array of differential pairs, each of said differential pairs having a first half providing a first differential and a second half providing a second differential signal, each of said second halves of said differential pairs having means for providing input signals in response to changes in said input signals, said means for providing input signals including a detector array, wherein each detector of said detector array is coupled at a first end to a detector ground bus and at a second end to one of said second halves, said amplifier having a system ground in addition to said detector ground bus, further comprising means for reducing cross-talk between said second differential signals, wherein said first differential signal is compared with said second differential signal for each differential pair to produce a resultant signal relating to said comparison for each differential pair, comprising:

means for generating a common first differential signal at a desired level;

means for comparing said common first differential signal with each of said second differential signals to produce said resultant signals; and means for amplifying each of said resultant signals.

6. The multi-channel differential amplifier in claim 5, wherein said detector array produces said input signals in response to changes in electromagnetic radiation detected by said detector array.

7. The multi-channel differential amplifier of claim 6, wherein said resultant signals correspond to said changes in electromagnetic radiation detected by said detector array.

8. A multi-channel differential amplifier, said differential amplifier having an array of differential pairs, each of said differential pairs having a first half providing a first differential signal and a second half providing a second differential signal, each of said second halves of said differential pairs having means for providing input signals to said second halves of said differential pairs to produce changes in said second differential signals in response to changes in said input signals, said means for providing input signals including a detector array, wherein each detector of said detector array is coupled at a first end to a detector ground bus and at a second end to one of said second halves of said differential pairs, said differential amplifier having a system ground in addition to said detector ground bus, and means for reducing cross-talk between said output signals which comprises:

means for generating a common first differential signal at a desired level;

ground sensing means coupled to said means for generating said common first differential signal such that said common first differential is related to signals on said detector ground bus; and means for comparing said common first differential signal with each of said second differential signals to produce said output signals, wherein said first differential signal is compared with said second differential signal for each differential pair to produce an output signal relating to said comparison for each differential pair, comprising:

means for reducing power consumption of said differential amplifier.

9. On an integrated circuit, a preamplifier comprising:

first circuit means for generating a first differential signal;

an array of second circuits, including means for generating a second differential signal for each of said second circuits, such that said second differential signals are at desired levels with respect to said first differential signal, each of said second circuits having means for providing input signals to said second circuits to produce changes in said second differential signals in response to changes in said input signals, said means for providing input signals including a detector array, wherein each detector of said detector array is coupled at a first end to a detector ground bus and at a second end to one of said second circuits, said preamplifier having a system ground in addition to said detector ground bus, further comprising means for reducing cross-talk between said second differential signals;

means for comparing said first differential signal with each of said second differential signals to provide resultant signals associated with each of said second circuits based upon said comparisons; and amplifier means for amplifying each of said resultant signals.

10. A system for use with an amplifier, comprising:

first circuit means for generating a first differential signal;

an array of second circuits, including means for generating a second differential signal for each of said second circuits, such that said second differential signals are at desired levels with respect to said first differential signal, each of said second circuits having means for providing input signals to said second circuits to produce changes in said second differential signals in response to changes in said input signals, said means for providing input signals including a detector array, wherein each detector of said detector array is coupled at a first end to a detector ground bus and at a second end to one of said second circuits, said amplifier having a system ground in addition to said detector ground bus, further comprising means for reducing cross-talk between said second differential signals; and means for comparing said first differential signal with each of said second differential signals to provide resultant signals associated with each of said second circuits based upon said comparisons.

* * * * *

UNITED STATES PATENT AND TRADEMARK OFFICE
CERTIFICATE OF CORRECTION

PATENT NO.    :  5,304,950

DATED         :  April 19, 1994

INVENTOR(S)   :  Mark V. Martin, et al

It is certified that error appears in the above-indentified patent and that said Letters Patent is hereby corrected as shown below:

Delete Drawing Sheets 3, 5, and 6, and substitute therefor the Drawing Sheets consisting of Figs. 4, 6C, 6A, and 6B, as shown on the attached pages.

Signed and Sealed this

Thirtieth Day of May, 1995

*Attest:*

BRUCE LEHMAN

*Attesting Officer*    *Commissioner of Patents and Trademarks*